United States Patent
Szabo et al.

(10) Patent No.: US 6,693,783 B2
(45) Date of Patent: Feb. 17, 2004

(54) BOUNCE TOLERANT FUSE TRIMMING CIRCUIT WITH CONTROLLED TIMING

(75) Inventors: Andras Szabo, San Jose, CA (US); Pekka Ojala, Fremont, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 10/118,687

(22) Filed: Apr. 8, 2002

(65) Prior Publication Data

US 2003/0197996 A1 Oct. 23, 2003

(51) Int. Cl.[7] .......................... H20H 5/00; H01H 85/46
(52) U.S. Cl. ........................... 361/104; 337/161
(58) Field of Search ................. 361/103, 104, 361/58, 106, 115; 337/159, 161–163, 290–299

(56) References Cited

U.S. PATENT DOCUMENTS 5,552,338 A * 9/1996 Kang ..................... 438/215
6,456,186 B1 * 9/2002 Oglesbee ................. 337/161
6,583,977 B1 * 6/2003 Oglesbee ................. 361/104

* cited by examiner

Primary Examiner—Gregory J. Toatley, Jr.
Assistant Examiner—Boris Benenson
(74) Attorney, Agent, or Firm—Townsend and Townsend and Crew, LLP

(57) ABSTRACT

A method and apparatus for implementing trimming circuits. More particularly, embodiments of the present invention provide a transistor that supplies sufficient current to trim a trimming fuse when the transistor is powered up and after it receives a select signal at its gate. When the trimming fuse is trimmed, it decouples undesired electrical connections in a circuit. Also provided is a delay structure that adds an RC delay to the select signal. The RC delay is of a sufficiently long duration so as to decrease the switching speed of the transistor. The delay structure also provides a pass filter to filter power and voltage spikes in the select signal.

20 Claims, 9 Drawing Sheets

BOUNCE TOLERANT FUSE TRIMMING CIRCUIT WITH CONTROLLED TIMING

BACKGROUND OF THE INVENTION

The present invention relates generally to integrated circuits. More particularly, embodiments of the invention relate to a method and apparatus for implementing trimming circuits.

Trimming circuits are used to configure and fine-tune IC products to meet final specification requirements. Such a trimming process typically occurs during the final stages of production. ICs are typically constructed with redundant circuit elements that are enabled or disabled by eliminating certain connections. The trimming process should reliably disengage undesired electrical connections while securely maintaining connections at other locations, as needed, for the lifetime of the product. Hereinafter, fuses are also referred to as trimming fuses.

One common method used for trimming involves intentional loading of certain metal structures—fuses—with current well beyond the carrying capability of the fuse line. This results in vaporization of the metal and electrical discontinuity. Trimming is usually done on automatic testing machines using test programs that select the fuses to be eliminated. Fuse trimming is done by passing several hundred milliamps through the metal line. This instantaneously heats up the fuse to a high enough temperature so that it vaporizes within microseconds. Typically, the current passes to the fuse through a dedicated pad. Also, the external circuit can include a power supply with sufficient current carrying capability to eliminate several fuses at a time.

Partial trimming can result in a trimmed fuse that has a lower than acceptable residual resistance. This is undesirable after trimming and for the lifetime of the product because once this occurs the fuse can not be trimmed again. If the residual conductance is not high enough, sufficient current is unable to flow through the fuse and dissipate adequate heat to vaporize the residual conductive material.

Partial trimming of the fuse can be caused by power spikes during a turn-on transition of the power supply. Power spikes can result from the bouncing of relays that turn on the power supply. Power spikes can also result from power ringing within the power supply. Power ringing occurs during the turn-on transition as the circuit used to trim the fuse is closed and a large load is instantaneously realized.

Thus, there is a need for an improved trimming circuit. The circuit should remove power bouncing and voltage spiking during trimming. This circuit should also be capable of conducting sufficient current through the trimming fuse to efficiently break the connection with high residual resistance.

BRIEF SUMMARY OF THE INVENTION

The present invention achieves the above needs with a method and circuitry for implementing trimming circuits. More particularly, embodiments of the present invention provide a transistor that supplies sufficient current to trim a trimming fuse when the transistor is powered up and after it receives a select signal at its gate. Also provided is a delay structure that adds an RC delay to the select signal. The RC delay is of a sufficiently long duration so as to decrease the switching speed of the transistor. The delay structure also provides a pass filter to filter power and voltage spikes in the select signal. Embodiments of the present invention enhance product yield by increasing the amount of IC products meeting specified performance requirements.

In one embodiment, the trimming circuit includes a delay structure that is designed into the gate of a transistor. In another embodiment, the trimming circuit includes a delay pad structure that is coupled between the first input pad and the gate of the transistor. In another embodiment, the trimming circuit includes a delay line structure coupled between the delay pad structure and the gate of the transistor. In other embodiments, the delay structure is designed into a combination of a gate of a transistor, an input pad, and a transmission line.

Another embodiment provides a delay transistor having a substrate, a plurality of conduction channels embedded in the substrate, and a plurality of active regions embedded in the substrate. The active regions alternate with the conduction channels to form source and drain portions of the delay transistor. Also included is a source contact coupled with first alternating active regions, a drain contact coupled with second alternating active regions, and a gate structure overlaying the conduction channels. The gate structure is configured to receive an input signal. The gate structure is a single gate structure. The gate structure has a serpentine shape to provide an RC delay to an input signal. The RC delay is of a sufficiently long duration so as to decrease the switching speed of the transistor. The RC attributes of the gate structure provide a pass filter to filter power and voltage spikes in the select signal.

Another embodiment provides a delay pad structure having a substrate and an active region embedded in the substrate. The active region is configured to receive an input signal. The active region has a serpentine shape to provide an RC delay to an input signal and to filter power and voltage spikes in the input signal. Also included is a plurality of diodes coupled with the active region. The diodes are reversed biased and provide additional capacitance to the RC delay.

Another embodiment provides a delay line structure having a substrate and a thin oxide layer coupled onto a first side of the substrate. Also, included is a polysilicon layer coupled onto the thin oxide layer. The polysilicon layer is configured to receive an input signal. The combination of the thin oxide layer coupled between the substrate and the polysilicon layer provide an RC delay to the input signal and to filter power and voltage spikes in the input signal. The thin oxide and polysilicon layers have a serpentine shape to provide additional RC delay to an input signal. Also, included is a plurality of diodes coupled with the polysilicon layer. The diodes are reversed biased and provide additional capacitance to the RC delay.

Embodiments of the present invention achieve their purposes and benefits in the context of known circuit and process technology and known techniques in the electronic and process arts. Further under standing, however, of the nature, objects, features, and advantages of the present invention is realized by reference to the latter portions of the specification, accompanying drawings, and appended claims. Other objects, features, and advantages of the present invention will become apparent upon consideration of the following detailed description, accompanying drawings, and appended claims.

DESCRIPTION OF THE SPECIFIC EMBODIMENTS

Figure 1:
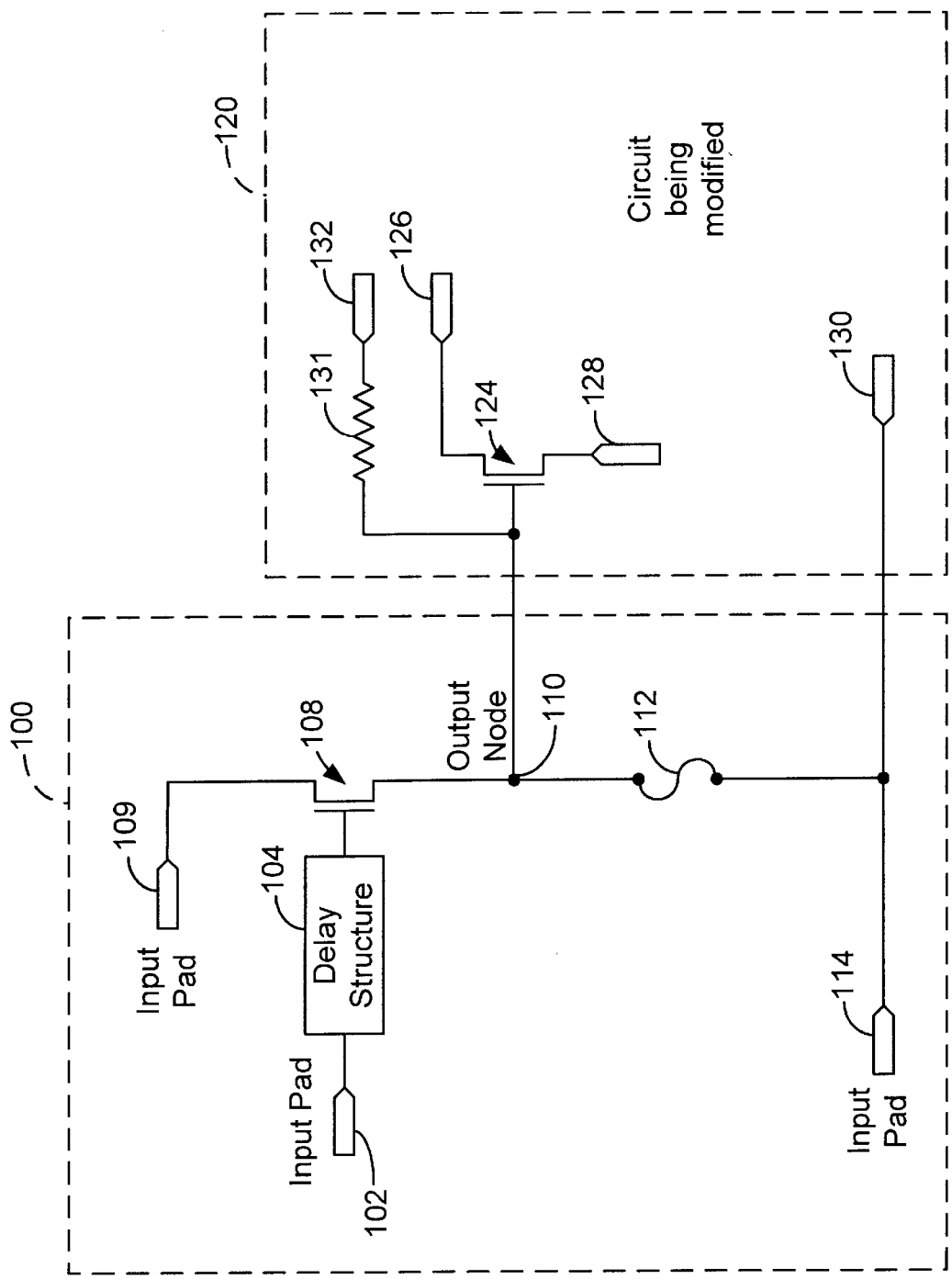
FIG. 1 shows a simplified high-level block diagram of an exemplary trimming circuit, according to an embodiment of the present invention.

FIG. 1 shows a simplified high-level block diagram of an exemplary trimming circuit 100, according to an embodiment of the present invention. Trimming circuit 100 includes an input pad 102 configured to receive a select signal (also referred to hereinafter as a trigger signal) and includes a delay structure 104 coupled with input pad 102. Delay structure 104 is configured to add a delay to the trigger signal. Trimming circuit 100 also includes a transistor 108 coupled with delay structure 104. The exact dimensions of transistor 108 will depend on the specific application. Transistor 108 is sized to provide sufficient current to trim a metal or polysilicon trimming fuse. Transistor 108 also couples between an input pad 109 and an output node 110. Input pad 109 is configured to receive a first voltage potential. In this particular embodiment, the first voltage potential is VDD. VDD can be a variety of voltages, e.g., 3 volts, 5 volts, 12 volts, etc. Typically, VDD is 3.3V. A trimming fuse 112 is coupled between output node 110 and an input pad 114. The required trimming fuse width will depend on the particular process technology and layer thickness of the fuse. Also, in this specific embodiment, trimming fuse 112 has a passivation opening above it to allow escape of residual material and heat. Input pad 114 is configured to receive a second voltage potential. In this particular embodiment, the second voltage potential is VSS. Typically, VSS is ground. Configuration with the first potential being VSS and the second potential being VDD is also possible.

Output node 110 couples to a circuit 120. In this particular example, circuit 120 includes a transistor 124 coupled between a node 126 and a node 128. Circuit 120 also includes resistive element 131 coupled between the gate of transistor 124 and node 132. The resistive element may be either conventional resistor or bipolar/MOS transistor with the base/gate properly biased. Nodes 126 and 128 can couple to any number of circuits, depending on the specific application of circuit 120. Nodes 126 and 128 can also be coupled with a variety of voltage sources such as VDD or VSS. The gate of transistor 124 weakly couples to node 132 through resistive element 131. Also, the gate of transistor 124 strongly couples with node 130 via trimming fuse 112. When fuse 112 has not been trimmed coupling of the gate of transistor 124 to node 130 overrides coupling of the gate to node 132. Similar to nodes 126 and 128, nodes 130 and 132 can couple to any number of circuits, depending on the specific application of circuit 120, and can also couple with a variety of voltage sources such as VDD or VSS.

In normal operation of circuit 120, the gate of transistor 124 is controlled by node 130 via trimming fuse 112. During a trimming operation, the parameters of circuit 120 can be modified by decoupling the gate of transistor 124 from node 130. This decoupling is accomplished as follows. A first voltage potential, VDD in this specific embodiment, is applied to input pad 109. Also, a second voltage potential, VSS in this specific embodiment, is applied to input pad 114. A trigger signal is applied to input pad 102 to turn on transistor 108. Transistor 108 is configured to supply sufficient current to trim trimming fuse 112 when transistor 108 turns on. When trimming fuse 112 is trimmed, it decouples output node 110 from node 130. In the absence of strong coupling through fuse 112 the weak coupling of the gate of transistor 124 through resistive element 131 to node 132 is in effect. While this decouples the gate of transistor 124 from node 130, it could also decouple other circuit elements that might be coupled to node 130 via trimming fuse 112. The actual couplings would of course depend on the specific application of circuit 120.

To filter power or voltage spikes in the trigger signal, delay structure 104 delays the trigger signal incoming via input pad 102 for a sufficiently long duration so as to decrease the switching speed of transistor 108. More specifically, delay structure 104 delays the rise time of the trigger signal by slowly and controllably ramping up its voltage one the rising edge. As a result, transistor 108 switches on slowly and controllably.

Delay structure 104 is effectively a low pass filter that reduces high frequency components of the trigger signal incoming via input pad 102. The filter is provided by the RC elements of delay structure 104. High frequency in the present embodiment is larger than approximately 3 kHz. Hence, any changes in the input signal occurring faster than ⅓ kHz≈330 microsecond are strongly attenuated. Power and voltage spikes that are shorter than approximately 330 microsecond are thus filtered. Thus, the delay structure would filter power surges less than 330 microseconds. The actual delay, however, is not limited to 330 microseconds and will vary depending on the specific application. Accordingly, power surges are filtered and accordingly would not be sufficient to initiate evaporation of trimming fuse 112.

It is to be understood that the implementation of FIG. 1 is merely an example and should not limit the scope of the claims herein. In light of the present invention, one of ordinary skill in the art would recognize many other variations, modifications, and alternatives. For example, in some embodiments, additional protection against power surges can be provided by increasing the delay. One way to increase or vary the delay could be by implementing a series of delay structures. Also, in some embodiments, delay structure 104 can be separate from transistor 108. In other embodiments, delay structure 104 is an integral part of transistor 108.

Figure 2:
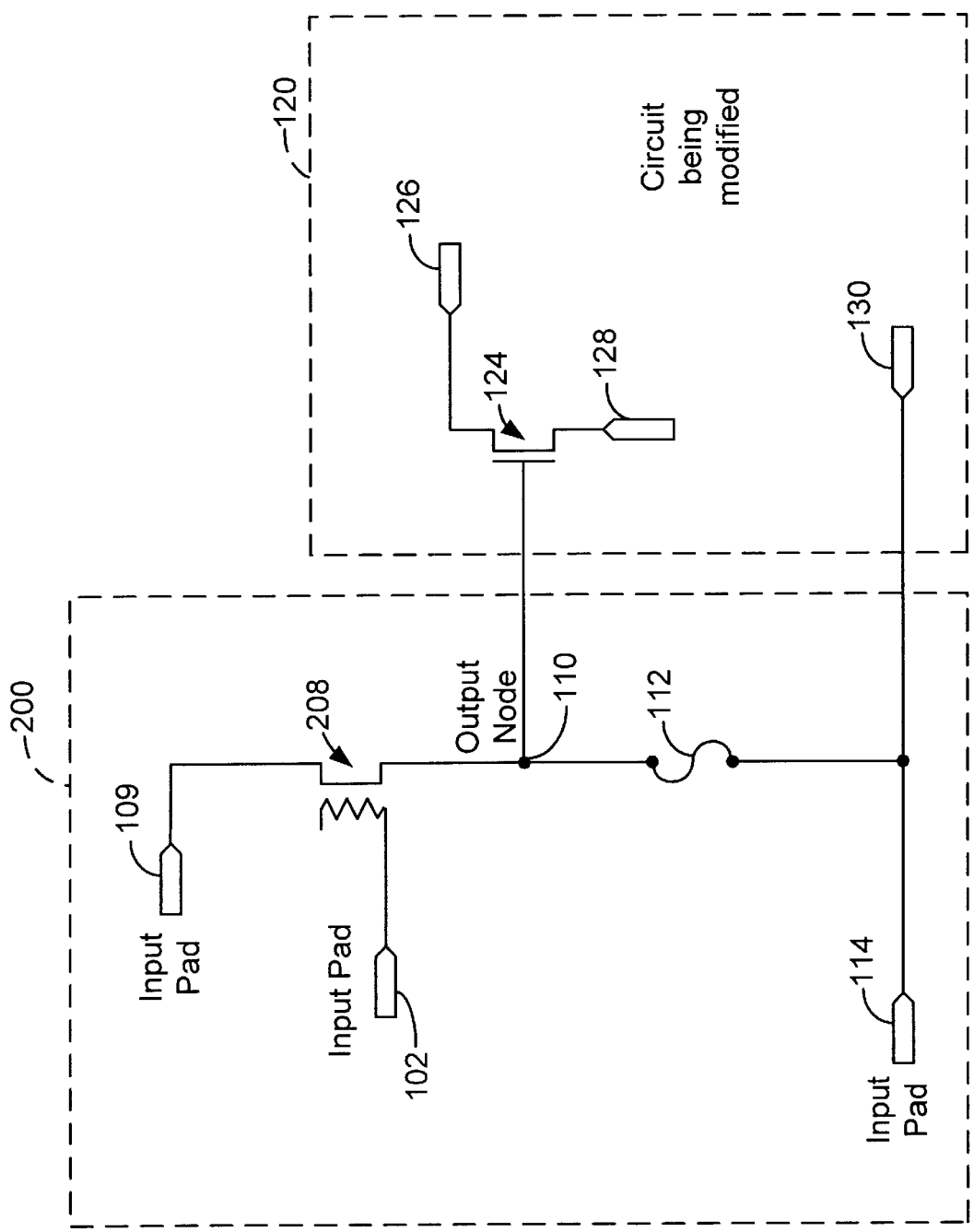
FIG. 2 shows a simplified high-level block diagram of an exemplary trimming circuit including a delay transistor, according to another embodiment of the present invention.

FIG. 2 shows a simplified high-level block diagram of an exemplary trimming circuit 200 including a delay transistor 208, according to another embodiment of the present invention. Trimming circuit 200 is configured and operates similarly to trimming circuit 100 except that a delay structure is an integral part of delay transistor 208. In this specific embodiment, the delay structure is a delay gate which couples to input pad 102. Delay transistor 208 couples between input pad 109 and output node 110.

The delay gate increases the rise time of the input signal and this way decreases the switching speed of delay transistor 208. As a result, transistor 208 switches on slowly and controllably. By being a low pass filter the delay gate attenuates any signal that occurs faster than the rise time of the input signal. In specific embodiment, delay transistor 208 is a wide channel transistor. The exact dimensions will of course depend on the specific application. In the specific embodiment shown in FIG. 2, delay transistor 208 is an NMOS transistor. Delay transistor 208 can also be other types of transistors such as a PMOS transistor. Also, a guard-band can be placed around transistor 208 for latch-up protection. Guard-bands are well-known in the art.

Alternative embodiments of the present invention can have more than one delay structure. Embodiments can have more than one delay gate, each coupled with a different trimming fuse. Also, a series of delay transistors can be used to increase or vary the delay.

Figure 3:
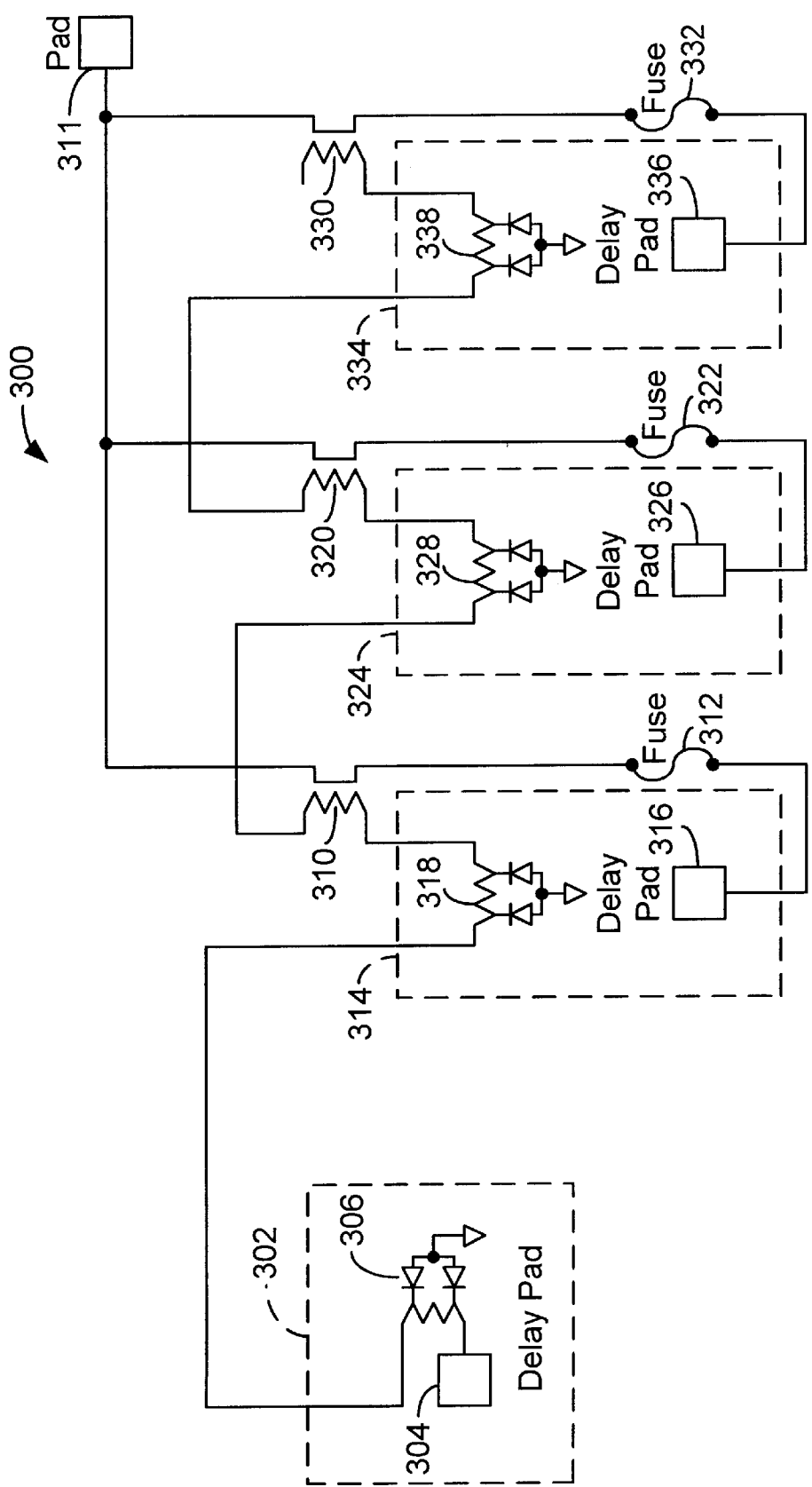
FIG. 3 shows a simplified high-level schematic diagram of an exemplary trimming circuit including delay transistors and delay pad structures, according to another embodiment of the present invention.

FIG. 3 shows a simplified high-level schematic diagram of an exemplary trimming circuit 300 including delay transistors and delay pad structures, according to another embodiment of the present invention. Trimming circuit 300 includes an input delay pad structure 302 which includes an input pad 304 coupled with a delay structure 306. Delay pad structure 302 is configured to receive a trigger signal. Trimming circuit 300 also includes delay transistor 310. Delay transistor 310 is structured and operates similarly to the delay transistor 208 of FIG. 2. Delay transistor 310 has a delay structure that is integrated with its gate. In this specific embodiment, delay transistor 310 has a delay gate coupled with delay pad structure 302. Transistor 310 couples between input pad 311 and a trimming fuse 312. Trimming fuse 312 couples with a delay pad structure 314. Delay pad structure 314 includes an input pad 316 spatially integrated but electrically not coupled with a delay structure 318. Delay structure 318 is coupled between delay pad structure 302 and the gate of delay transistor 310.

Trimming circuit also includes delay transistor 320. Delay transistor 320 is structured and operates similarly to delay transistor 310. In this specific embodiment, transistor 320 has a delay gate coupled with the delay gate of delay transistor 310. Transistor 320 couples between input pad 311 and a trimming fuse 322. Trimming fuse 322 couples with a delay pad structure 324. Delay pad structure 324 includes input pad 326 that is spatially integrated with but electrically not coupled to delay structure 328.

Trimming circuit also includes delay transistor 330. Delay transistor 330 is structured and operates similarly to the delay transistor 310. In this specific embodiment, transistor 330 has a delay gate coupled with the delay gate of delay transistor 320. Transistor 330 couples between input pad 311 and a trimming fuse 332. Trimming fuse 332 couples with a delay pad structure 334. Delay pad 334 includes an input pad 336 coupled with a delay structure 338. In this specific embodiment, delay structure 338 is built under input pad 336. Delay structure 338 can also be located elsewhere.

Input pad 311 is configured to receive a first voltage potential. In this specific embodiment, input pad 311 is configured to receive a VSS voltage. Delay pads 314, 324, and 334 are configured to receive a second voltage potential. In this specific embodiment, delay pads 314, 324, and 334 are configured to receive a VDD voltage.

Trimming circuit 300 operates similarly to trimming circuit 200 of FIG. 2 except that trimming circuit 300 includes a delay pad structure to add additional delay to the trigger signal. Also, trimming circuit 300 includes multiple delay transistors, each with corresponding trimming fuses and delay pad structures. Accordingly, trimming circuit 300 can readily modify more parameters of a circuit to be modified by trimming more fuses. How each specific fuse couples with such a circuit will depend on the specific application of the circuit.

During a trimming operation, a decoupling of two nodes coupled by a trimming fuse occurs when the corresponding trimming fuse is trimmed. A first voltage potential, VSS in this specific embodiment, is applied to input pad 311. A second voltage potential, VDD in this specific embodiment, is applied to one or more of input pads 314, 324, and 334 depending on the fuses to be trimmed. Then, a trigger signal is applied to delay pad 302 to turn on the delay transistors connected to the first and second voltage potentials. When the appropriate transistors are turned on, they supply sufficient current to trim their corresponding trimming fuses in effect decoupling the nodes coupled by these trimming fuses.

The trigger signal incoming through delay pad 302 passes through delay structure 318, delay transistor 310, delay structure 328, delay transistor 320, delay structure 338 and finally reaches delay transistor 330. The rise time of the trigger signal cumulatively increases every time it passes through a delay element either integrated within a pad or in a transistor. The increased rise time results in increased filtering of voltage spikes potentially present in the trigger signal. Every time the trigger signal passes through a transistor gate it opens the transistor and if the associated fuse has been pre-selected for trimming by connecting the associated delay pad to VDD the fuse is trimmed. The trigger signal rise time monotonically increases as it sequentially reaches transistors 310, 320 and 330, thus the transistors will turn on sequentially. Also, the filtering of spikes potentially present in the trigger signal entering delay pad 302 will increase as the on transistors 310, 320 and 330, in that order. Besides providing increasing protection against spikes in the trigger signal, the sequential turn on alleviates the load on the power supply providing VDD for the circuit, as load is distributed in time. Alternative embodiments of the present invention can also have a delay structure coupled to trimming fuse 312 via other elements. For example, a delay structure can be placed anywhere along the path between input pad 311 and trimming fuse 312. This would filter power or voltage spikes in signals coming through pad 311.

Figure 4:
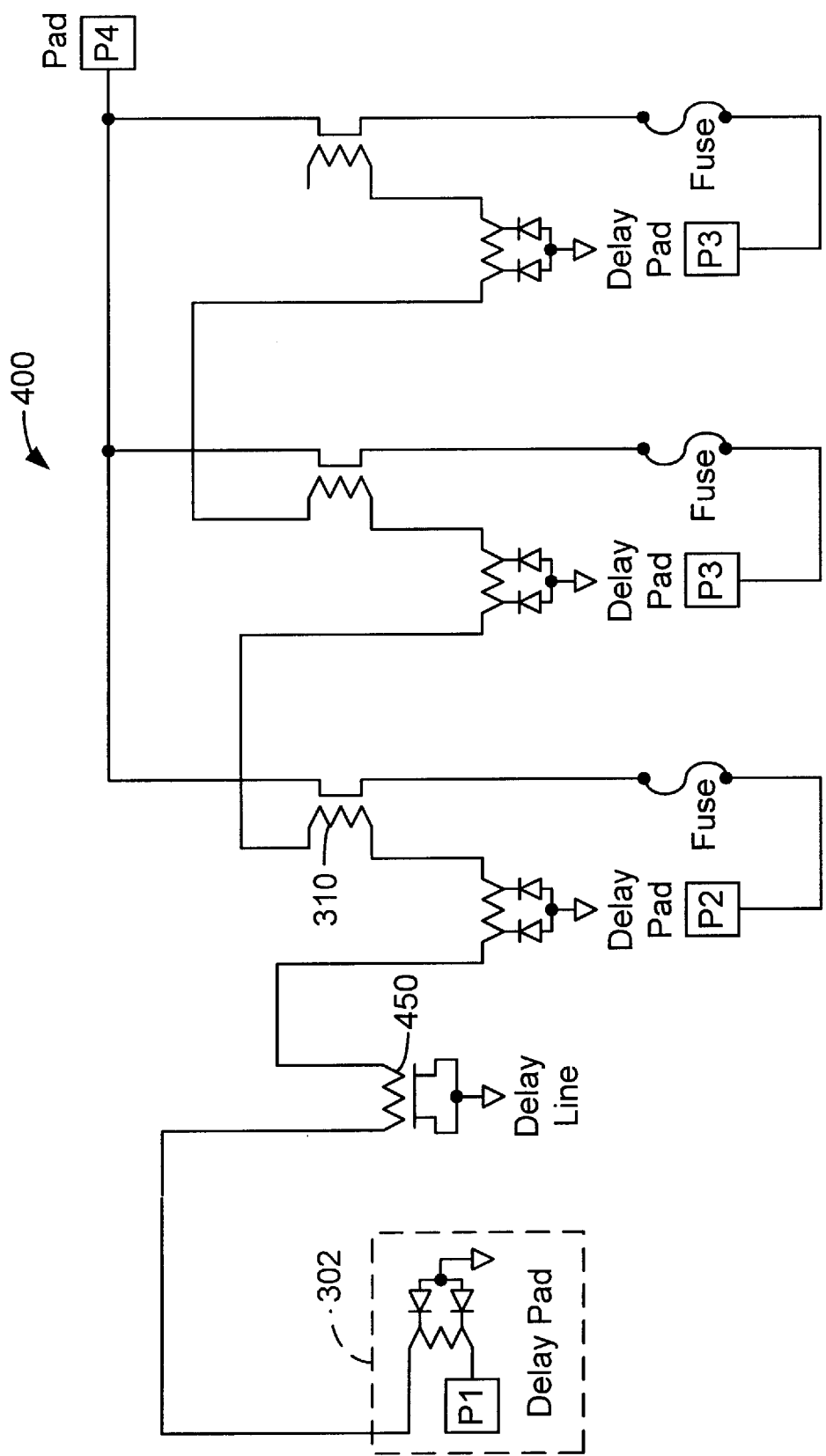
FIG. 4 shows a simplified high-level schematic diagram of an exemplary trimming circuit including delay transistors, delay pad structures, and a delay line structure, according to another embodiment of the present invention.

FIG. 4 shows a simplified high-level schematic diagram of an exemplary trimming circuit 400 including delay transistors, delay pad structures, and a delay line structure, according to another embodiment of the present invention. Trimming circuit 400 is structured and operates similarly to trimming 300 except that trimming circuit 400 has a delay line structure 450 coupled between delay pad 302 and delay transistor 310. Delay line structure 450 adds an additional trigger signal delay to the delay provided by the other delay structures shown in FIG. 400. Alternative embodiments of the present invention can have more than one delay line structure. Also, embodiments can have more than one delay pad structure configured to receive trigger signals.

Figure 5:
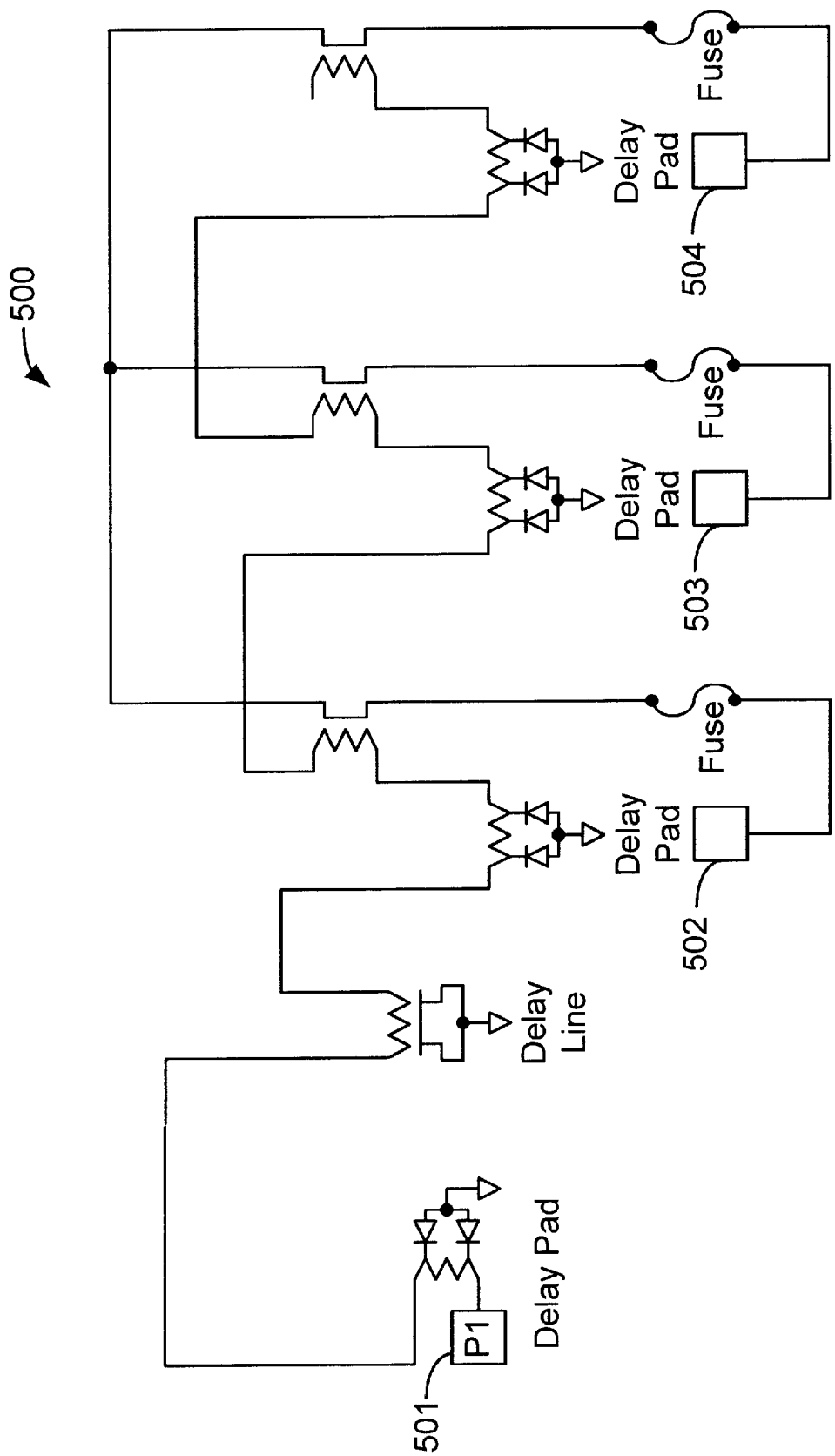
FIG. 5 shows a simplified high-level schematic diagram of an exemplary trimming circuit including delay transistors, delay pad structures, and a delay line structure, according to another embodiment of the present invention.
Figure 6:
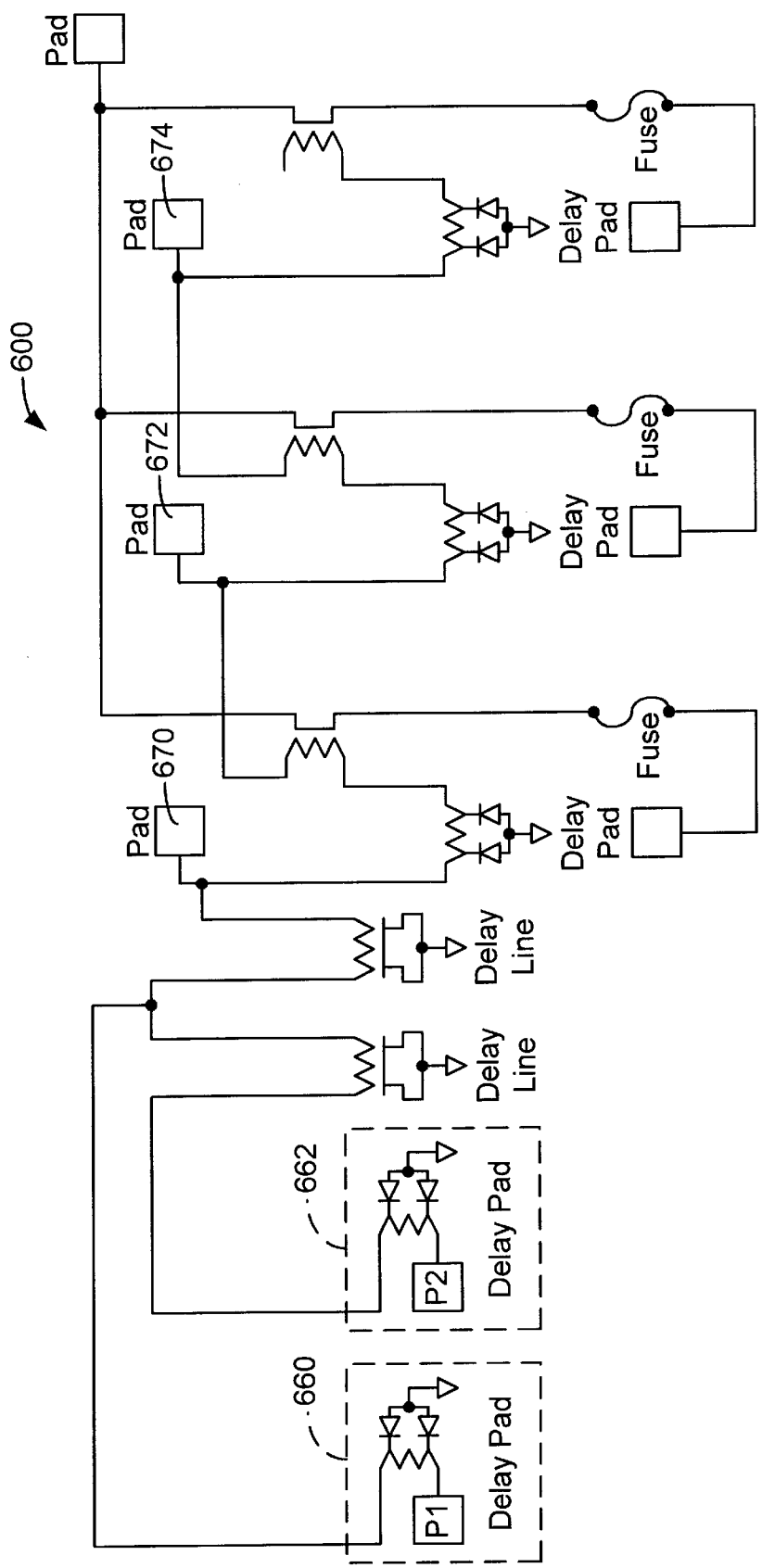
FIG. 6 shows a simplified high-level schematic diagram of an exemplary trimming circuit including delay transistors, delay pad structures, and a delay line structure, according to another embodiment of the present invention.

FIGS. 5 and 6 show a simplified high-level schematic diagram of an exemplary trimming circuit including delay transistors, delay pad structures, and a delay line structure, according to another embodiment of the present invention. FIG. 5 shows a trimming circuit 500 is similar to the trimming circuit of FIG. 4 except that the input pad that receives a trigger signal and the input pad that receives a first voltage potential to supply power to the delay transistors are the same input pad. For this implementation delay pad 501 is connected to VDD and delay pad 502, 503 and 504 are optionally connected to VSS if trimming of the associated fuses is desired.

FIG. 6 shows a trimming circuit 600 that is configured to allow for more variety in the trigger signal delays depending on whether a delay pad 660 or a delay pad 662 is used. Also, test pads 670, 672, and 674 are added to provide probe contacts. Residual fuse resistance can be tested with these additional test pads.

Figure 7:
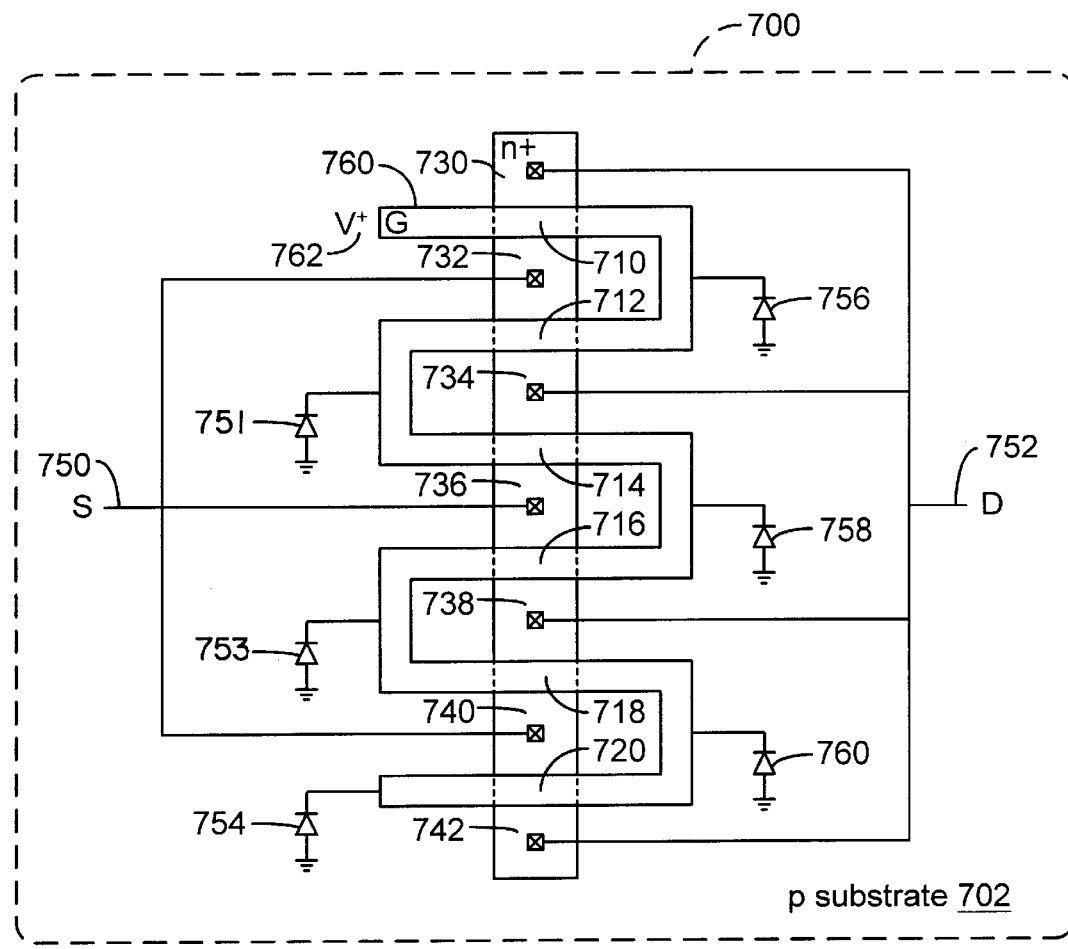
FIG. 7 shows a top-view layout of an exemplary delay transistor structure, according to an embodiment of the present invention.

FIG. 7 shows a top-view layout of an exemplary delay transistor structure 700, according to an embodiment of the present invention. Delay transistor 700 includes a substrate 702 and conduction channels 710, 712, 714, 716, 718, and 720 embedded in substrate 702. Delay transistor 700 also includes active regions 730, 732, 734, 736, 738, 740, and 742 embedded in the substrate. The active regions alternate with the conduction channels. A source contact 750 couples with alternating active regions. A drain contact 752 couples with the other alternating active regions. A gate structure 760 overlays the conduction channels 710, 712, 714, 716, 718, and 720. In this specific embodiment, gate structure 760 is a single gate structure made of polysilicon and has a serpentine shape. In this specific embodiment, delay transistor 700 is an NMOS transistor. The substrate is a p-type substrate and the active regions are n+ wells. In other embodiments, delay transistor 700 can other types of transistors such as a PMOS transistor.

The gate structure is configured to receive an input signal 762. In operation, the gate structure provides an RC delay to input signal 762 and the RC delay is of a sufficiently long duration so as to decrease the switching speed of the transistor. Delay transistor 700 also includes diodes 751, 753, 754, 756, 758, and 760 coupled with gate structure 760. These diodes are reversed biased such that they contribute additional capacitance to the RC delay. In this specific embodiment, the diodes also coupled with substrate 702. The diodes also have the benefit of enhancing process reliability. In light of the present invention, one of ordinary skill in the art would recognize many other variations, modifications, and alternatives. Alternative embodiments, for example, can include more conduction channels and action regions than does the specific embodiment of delay transistor 700.

Figure 8:
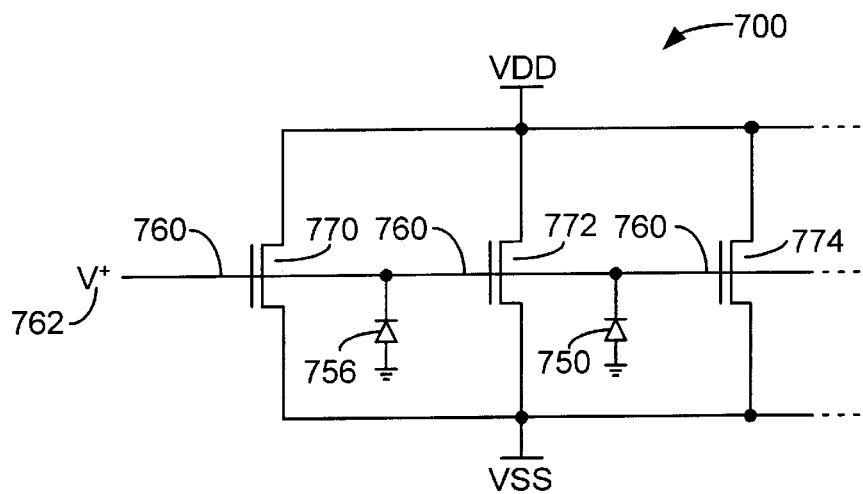
FIG. 8 shows a simplified high-level schematic diagram of the delay transistor structure of FIG. 7, according to another embodiment of the present invention.

FIG. 8 shows a simplified high-level schematic diagram of the delay transistor structure of FIG. 7, according to another embodiment of the present invention. For simplicity, FIG. 8 shows only three transistors 770, 772, and 774. Transistors 770, 772, and 774 coupled in parallel between VDD and VSS. Diodes 756 and 750 couple between gate 760 and the substrate. The gates are formed by a single gate structure, wherein the combination of the gate and the diodes provide a distributed RC delay to decrease the switching speed of the transistors and filter power and voltage spikes in the trigger signal.

Figure 9:
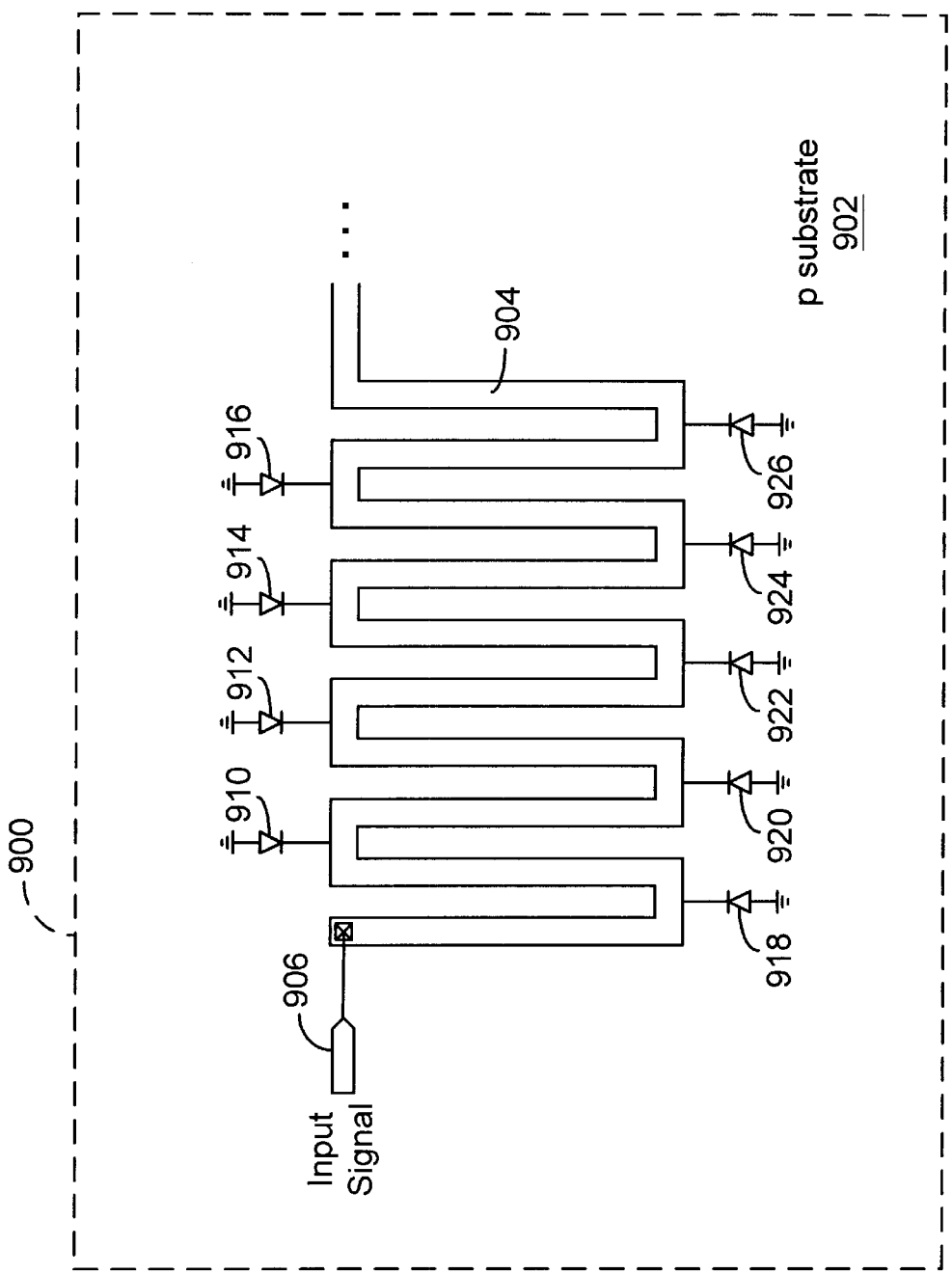
FIG. 9 shows a top-view layout of an exemplary delay pad structure, according to an embodiment of the present invention.

FIG. 9 shows a top-view layout of an exemplary delay pad structure 900, according to an embodiment of the present invention. Delay pad structure 900 includes a substrate 902. In this specific embodiment the substrate is a p-type substrate. Delay pad structure 900 also includes an active region 904 embedded in substrate 902. In this specific embodiment, active region is an n+ region. Active region 904 is configured to receive and transmit an input signal 906. Active region 904 has a serpentine shape such that it provides an RC delay to signal 906. Delay pad structure 900 also includes diodes 910, 912, 914, 916, 918, 920, 922, 924, and 926 coupled between the active region 904 and substrate 902. The diodes are reversed biased to provide additional capacitance to the RC delay. The diodes also have the benefit of enhancing process reliability. In application, delay pad structure 900 can be used the trimming circuits described above. Alternative embodiments will be recognized in light of the present invention. For example, in other embodiments the substrate can be an n-type substrate and the active region can be an p+ region.

Figure 10:
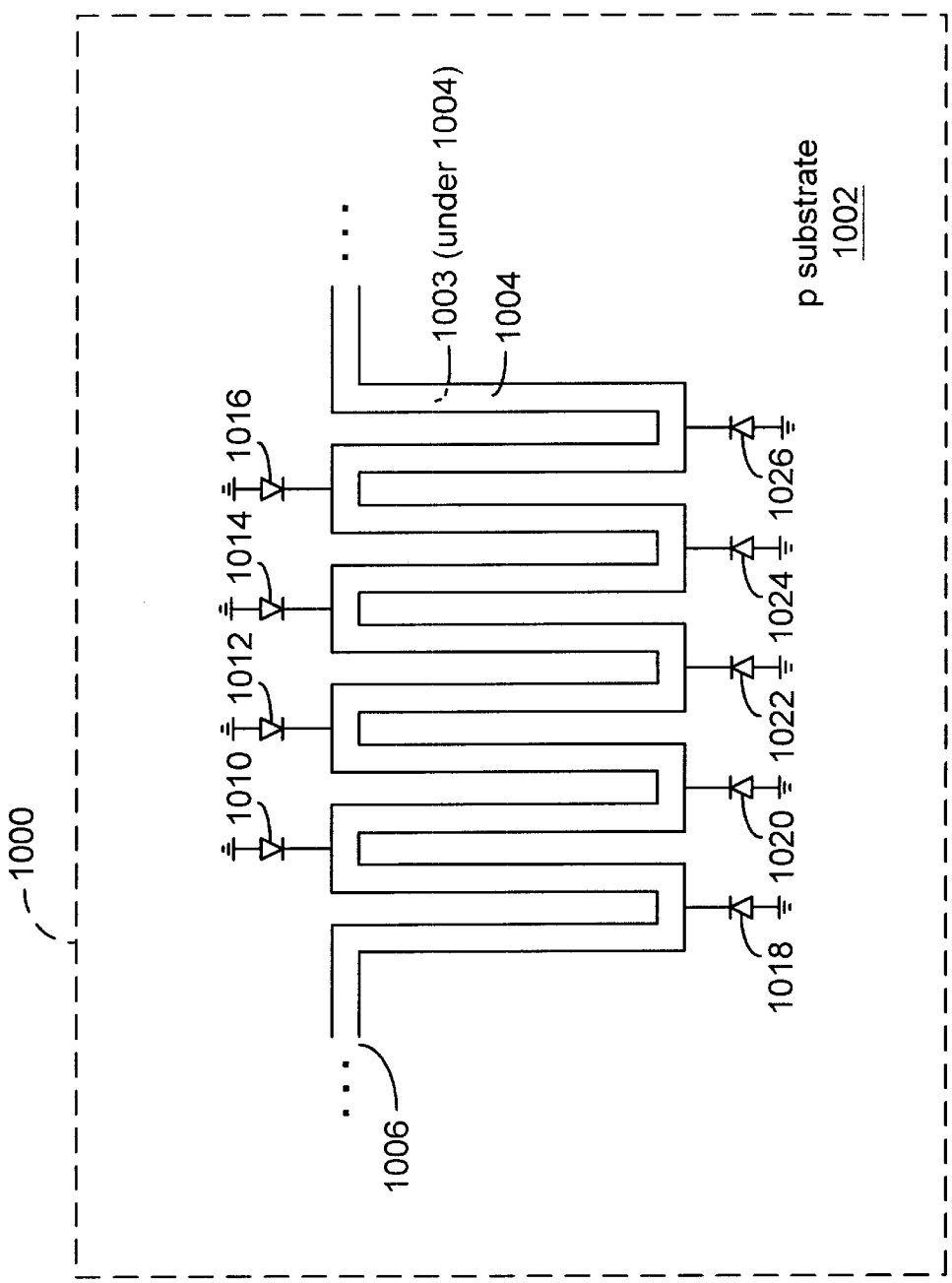
FIG. 10 shows a top-view layout of an exemplary delay line structure, according to an embodiment of the present invention.

FIG. 10 shows a top-view layout of an exemplary delay line structure 1000, according to an embodiment of the present invention. Delay line structure 1000 includes a substrate 1002. In this specific embodiment the substrate is a p-type substrate. Delay line structure 1000 also includes a thin oxide layer 1003 coupled onto substrate 1002. The thin oxide layer 1003 has a square shape. A polysilicon layer 1004 couples onto the thin oxide layer and also has a serpentine shape. Polysilicon layer 1004 is configured to receive and transmit a signal 1006. The combination of the thin oxide layer coupled between the substrate and the polysilicon layer providing an RC delay to input signal 1006.

Delay line structure also includes diodes 1010, 1012, 1014, 1016, 1018, 1020, 1022, 1024, and 1026 coupled between polysilicon layer 1004 and substrate 1002. The diodes are reversed biased to provide additional capacitance to the RC delay. The diodes also have the benefit of enhancing process reliability. In application, delay line structure 1000 can be used the trimming circuits described above. In alternative embodiments, the substrate can be an n-type substrate.

CONCLUSION

In conclusion, it can be seen that embodiments of the present invention provide numerous advantages. Principally, they eliminate problems and limitations resulting from power and voltage spikes. Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. A trimming circuit for modifying electronic circuits, the trimming circuit comprising:

a first input pad configured to receive a trigger signal;

a delay structure coupled to the first input pad, the delay structure being configured to add a first delay to the trigger signal and to filter power and voltage spikes in the trigger signal;

a transistor coupled to the delay structure, the transistor being configured to couple between a first voltage potential and an output node, the first delay being of a sufficiently long duration so as to decrease the switching speed of the transistor to allow the delay structure to filter power and voltage spikes in the trigger signal; and a trimming fuse having a first end and a second end, the first end being coupled with the output node, the second end being configured to couple to a second voltage potential, wherein the transistor supplies sufficient current to trim the trimming fuse when the transistor turns on, and wherein the trimming fuse decouples the output node from the second end of the trimming fuse when the trimming fuse is trimmed.

2. The trimming circuit of claim 1 wherein the delay structure comprises a delay gate coupled to the first input pad, the delay gate being the gate of the transistor.

3. The trimming circuit of claim 1 wherein the delay structure comprises a delay pad structure coupled between the first input pad and the transistor.

4. The trimming circuit of claim 1 wherein the delay structure comprises a delay line structure coupled between the first input pad and the transistor.

5. The trimming circuit of claim 1 wherein the delay structure comprises at least one of a delay gate coupled to the first input pad, a delay pad structure coupled between the first input pad and the transistor, and the delay line structure coupled between the first input pad and the transistor.

6. The trimming circuit of claim 1 wherein a delay structure couples with at least one of the first and second ends of the trimming fuse to filter power and voltage spikes at those ends.

7. The trimming circuit of claim 1 wherein the trigger signal provides the first voltage potential.

8. The trimming circuit of claim 1 wherein a VDD source provides the first voltage potential.

9. A trimming circuit for modifying electronic circuits, the trimming circuit comprising:

a first input pad configured to receive a trigger signal;

a delay transistor configured to couple between a first voltage potential and an output node, the delay transistor having a delay gate coupled to the first input pad, the delay gate being a first delay structure configured to add a first delay to the trigger signal and to filter power and voltage spikes in the trigger signal, the first delay being of a sufficiently long duration so as to decrease the switching speed of the delay transistor and to allow the delay gate to filter power and voltage spikes in the trigger signal; and a trimming fuse having a first end and a second end, the first end being coupled with the output node, the second end being configured to receive a second voltage potential, wherein the delay transistor supplies sufficient current to trim the trimming fuse when the delay transistor turns on, and wherein the trimming fuse decouples the output node from the second end when the trimming fuse is trimmed.

10. The trimming circuit of claim 9 further comprising a second delay structure coupled between the first input pad and the delay gate, the delay structure being configured to increase the first delay and to further filter power and voltage spikes in the trigger signal.

11. The trimming circuit of claim 10 wherein the delay structure comprises a delay pad structure coupled between the first input pad and the delay gate, the delay pad structure being configured to increase the first delay and to further filter power and voltage spikes in the trigger signal.

12. The trimming circuit of claim 10 wherein the delay structure comprises a delay line structure coupled between the delay pad structure and the delay gate, the delay line structure being configured to increase first delay and to further filter power and voltage spikes in the trigger signal.

13. The trimming circuit of claim 10 wherein the delay structure comprises a delay pad structure coupled between the first input pad and the delay gate, wherein the delay structure further comprises a delay line structure coupled between the delay pad structure and the delay gate, each of the delay pad structure and the delay line structure being configured to further increase the first delay and to further filter power and voltage spikes in the trigger signal.

14. The trimming circuit of claim 9 wherein a delay structure couples with at least one of the first and second ends of the trimming fuse to filter power and voltage spikes at those ends.

15. The trimming circuit of claim 9 wherein the trigger signal provides the first voltage potential.

16. The trimming circuit of claim 9 wherein a VDD source provides the first voltage potential.

17. The trimming circuit of claim 9 wherein the delay transistor is a wide channel transistor.

18. The trimming circuit of claim 9 wherein the delay transistor is an NMOS transistor.

19. The trimming circuit of claim 9 wherein the delay transistor is a PMOS transistor.

20. A method for modifying an electrical circuit, the method comprising:

providing a trimming fuse between at least two circuit nodes;

providing a transistor to supply sufficient current to trim the trimming fuse when the transistor turns on;

receiving a trigger signal to turn on the transistor;

delaying the rise time of the trigger signal for a sufficiently long duration so as to decrease the switching speed of the delay transistor and to filter power and voltage spikes in the trigger signal; and decoupling the circuit nodes when the trimming fuse is trimmed.

* * * * *